United States Patent [19]

Eichelberger et al.

[11] Patent Number: 5,094,709

[45] Date of Patent: Mar. 10, 1992

[54] APPARATUS FOR PACKAGING INTEGRATED CIRCUIT CHIPS EMPLOYING A POLYMER FILM OVERLAY LAYER

[75] Inventors: Charles W. Eichelberger, Schenectady; Robert J. Wojnarowski, Ballston Lake; Kenneth B. Welles, II, Schenectady, all of N.Y.

[73] Assignee: General Electric Company, Schenectady, N.Y.

[21] Appl. No.: 516,895

[22] Filed: Apr. 26, 1990

Related U.S. Application Data

[60] Division of Ser. No. 240,367, Aug. 30, 1988, Pat. No. 4,933,042, which is a continuation of Ser. No. 912,455, Sep. 26, 1986, abandoned.

[51] Int. Cl.$^5$ .................. B32B 31/00; B32B 31/24
[52] U.S. Cl. ................................ 156/380.9; 156/382
[58] Field of Search .............. 156/382, 380.9, 272.2, 156/285, 286

[56] References Cited

U.S. PATENT DOCUMENTS

| | | | |
|---|---|---|---|
| 2,725,091 | 11/1955 | Miner et al. | 156/498 |
| 3,290,756 | 12/1966 | Dreyer | 29/155.5 |
| 3,322,598 | 5/1967 | Marks et al. | 156/382 |
| 3,347,729 | 10/1967 | Seefluth | 156/498 |
| 3,420,727 | 1/1969 | Beck | 156/498 |
| 3,679,941 | 7/1972 | LaCombe et al. | 317/101 A |
| 3,691,628 | 9/1972 | Kim et al. | 29/577 |
| 3,702,025 | 11/1972 | Archer | 29/574 |
| 4,052,241 | 10/1977 | Walter | 156/245 |
| 4,300,153 | 11/1981 | Hayakawa et al. | 357/80 |
| 4,347,306 | 8/1982 | Takeda et al. | 427/96 |
| 4,388,132 | 6/1983 | Hoge et al. | 156/153 |
| 4,417,393 | 11/1983 | Becker | 29/846 |
| 4,421,589 | 12/1983 | Armini et al. | 156/382 |
| 4,426,773 | 1/1984 | Hargis | 29/832 |
| 4,588,468 | 5/1986 | McGinty et al. | 156/345 |
| 4,613,891 | 9/1986 | Ng et al. | 357/68 |
| 4,617,085 | 10/1986 | Cole et al. | 156/643 |
| 4,677,528 | 6/1987 | Minet | 361/398 |
| 4,718,967 | 1/1988 | Irie | 156/380.9 |
| 4,787,951 | 11/1988 | Okamoto | 156/285 |

FOREIGN PATENT DOCUMENTS

| | | | |
|---|---|---|---|
| 0010657 | 11/1979 | European Pat. Off. | |
| 0175870 | 12/1981 | European Pat. Off. | |
| 0111128 | 10/1983 | European Pat. Off. | |
| 0178227 | 4/1986 | European Pat. Off. | |
| 0228694 | 12/1986 | European Pat. Off. | |
| 2210475 | 10/1973 | Fed. Rep. of Germany | |
| 2639999 | 3/1978 | Fed. Rep. of Germany | 156/498 |
| 2915923 | 10/1980 | Fed. Rep. of Germany | |
| 0152334 | 2/1985 | Fed. Rep. of Germany | |
| 53-006341 | 1/1978 | Japan | 156/285 |
| 56-99624 | 8/1981 | Japan | 156/382 |
| 57-105310 | 6/1982 | Japan | 156/382 |
| 59-104907 | 6/1984 | Japan | |

(List continued on next page.)

OTHER PUBLICATIONS

Auletta, L. V. et al., "Flexible Tape Conductor Interconnection for Chips", IBM Technical Disclosure Bulletin, vol. 24, No. 2, Jul. 1981, pp. 1214-1215.

(List continued on next page.)

Primary Examiner—Michael W. Ball
Assistant Examiner—Adrienne C. Johnstone
Attorney, Agent, or Firm—Marvin Snyder; James C. Davis, Jr.

[57] ABSTRACT

A method and apparatus are provided for disposing a polymer film on an irregularly-shaped substrate at relatively high temperatures. In particular, the method and apparatus of the present invention provide a system for the packaging of very large scale integrated circuit chips. The system of the present invention particularly solves problems associated with high temperature processing and problems associated with the highly irregular surfaces that result. Nonetheless, the resultant product is capable of being fashioned into circuit chip systems which are independently testable and which may be reconfigured after testing by removal of the polymer film itself.

6 Claims, 11 Drawing Sheets

FOREIGN PATENT DOCUMENTS

| | | |
|---|---|---|
| 60-15124 | 1/1985 | Japan . |
| 61-56419 | 3/1986 | Japan . |
| 1171360 | 8/1985 | U.S.S.R. ............................. 156/382 |
| 740811 | 11/1955 | United Kingdom ................ 156/498 |

OTHER PUBLICATIONS

IBM Technical Disclosure Bulletin, vol. 28, No. 5, Oct. 1985, "Lift-Off Stencil Created by Laser Ablation", p. 2034.

Egitto, F. D. et al., "Plasma Etching of Organic Materials. I. Polyimides in O2-CF4", Journal of Vacuum Science & Technology/B3 (1985), May-Jun., No. 3, pp. 893-904.

Lukaszek W. et al., "CMOS Test Chip Design for Process Problem Debugging and Yield Prediction Experiments", Solid State Technology, Mar. 1986, pp. 87-93.

Jubb, Charles, "PC Board Layout Via AutoCAD", Cadence, vol. 1, No. 2, pp. 51-55.

Angell, Richard, "End-to-End Design", PC Tech Journal, vol. 4, No. 11, Nov. 1986, pp. 97-100, 102-104, 106, 108, 112, 114, 116, 118-119.

Clark, R. J. and Nakagawa, T., "The STD Process-New Developments and Applications", Abstract from the 1974 Microelectronics Symposium held Oct. 1974, pp. 131-144.

High Technology, Oct. 1986, p. 55.

"Embedding ICs in Plastic Cuts Interconnect Space", Electronics, Jun. 9, 1986, pp. 17 and 20.

Hennpenheimer, T. A., "Monster Chips", Popular Science, pp. 104, 106, 108 and 110.

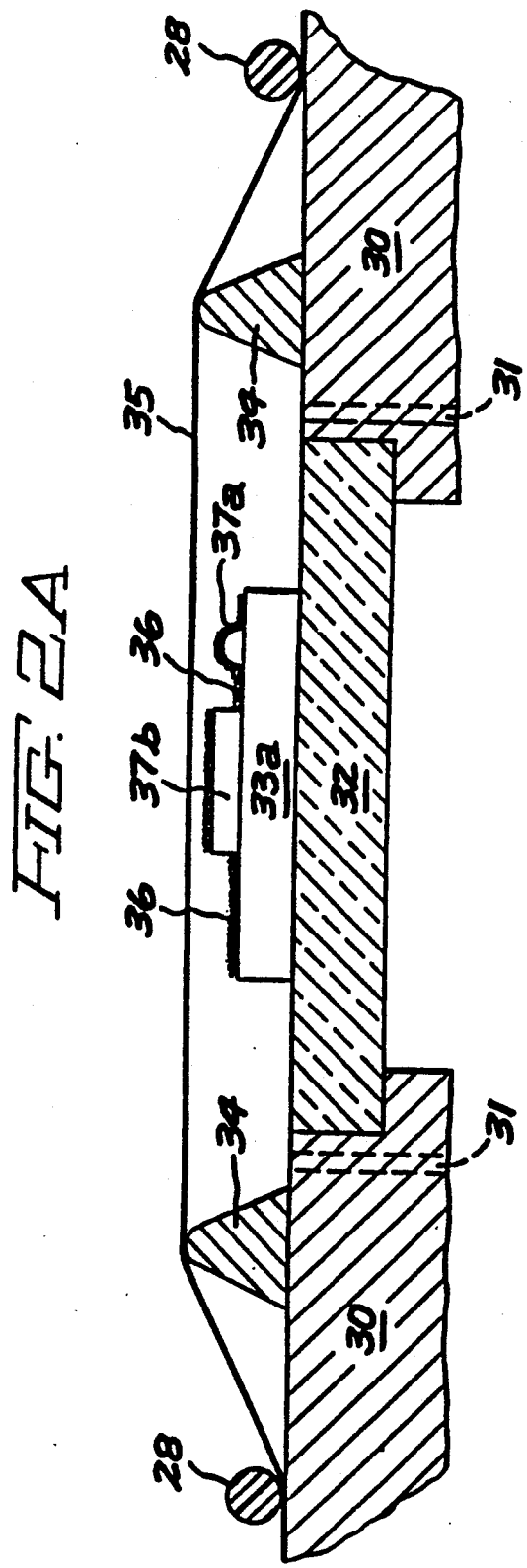

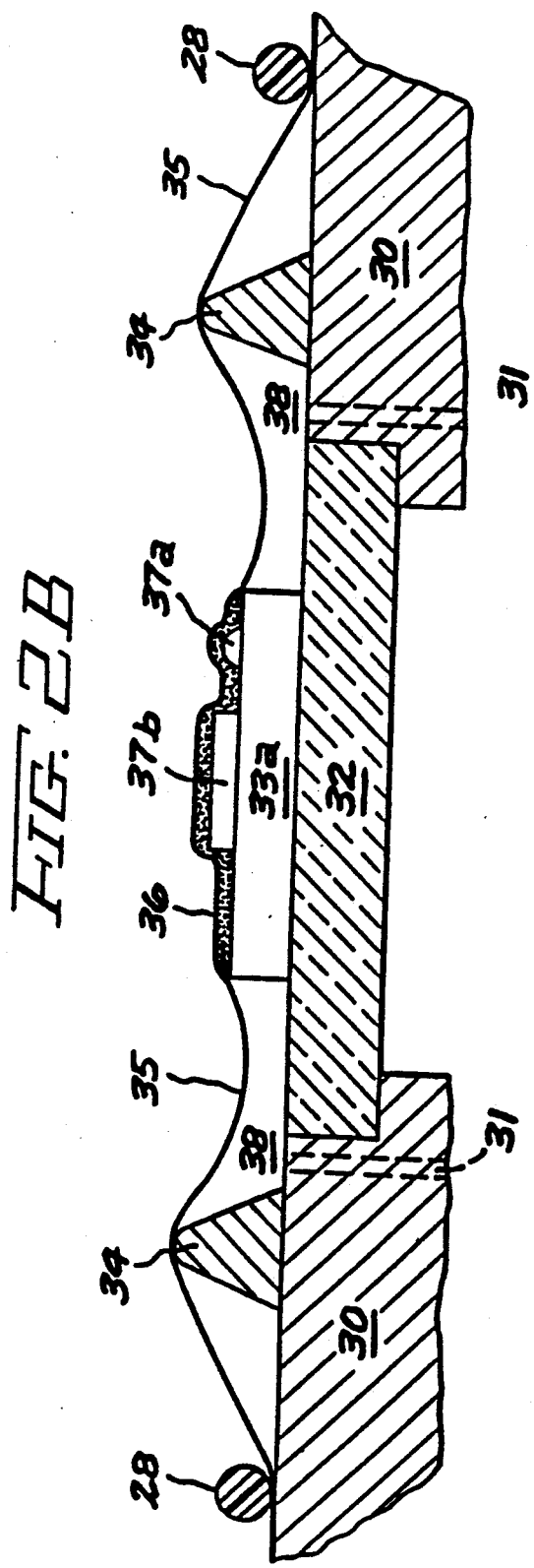

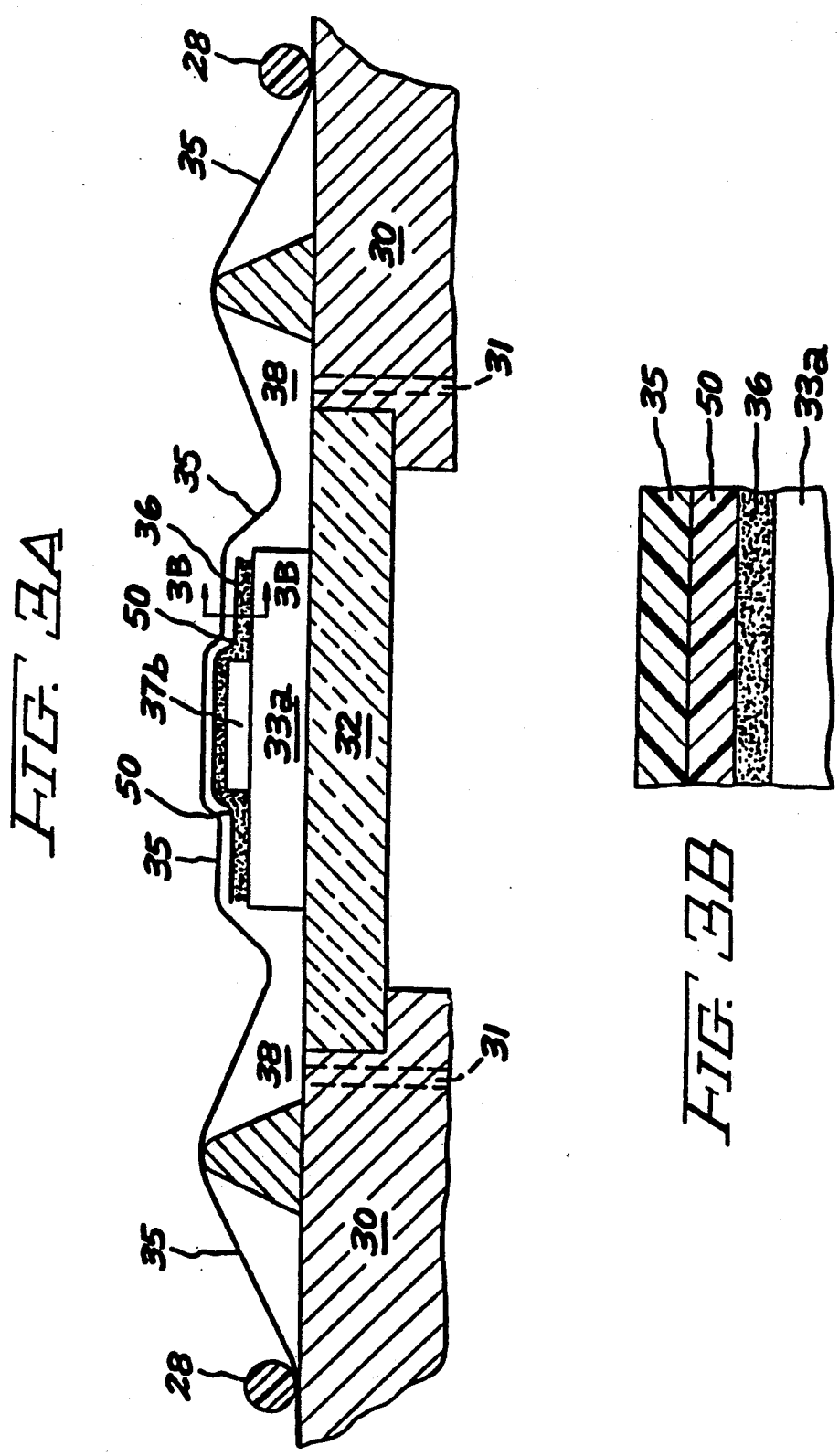

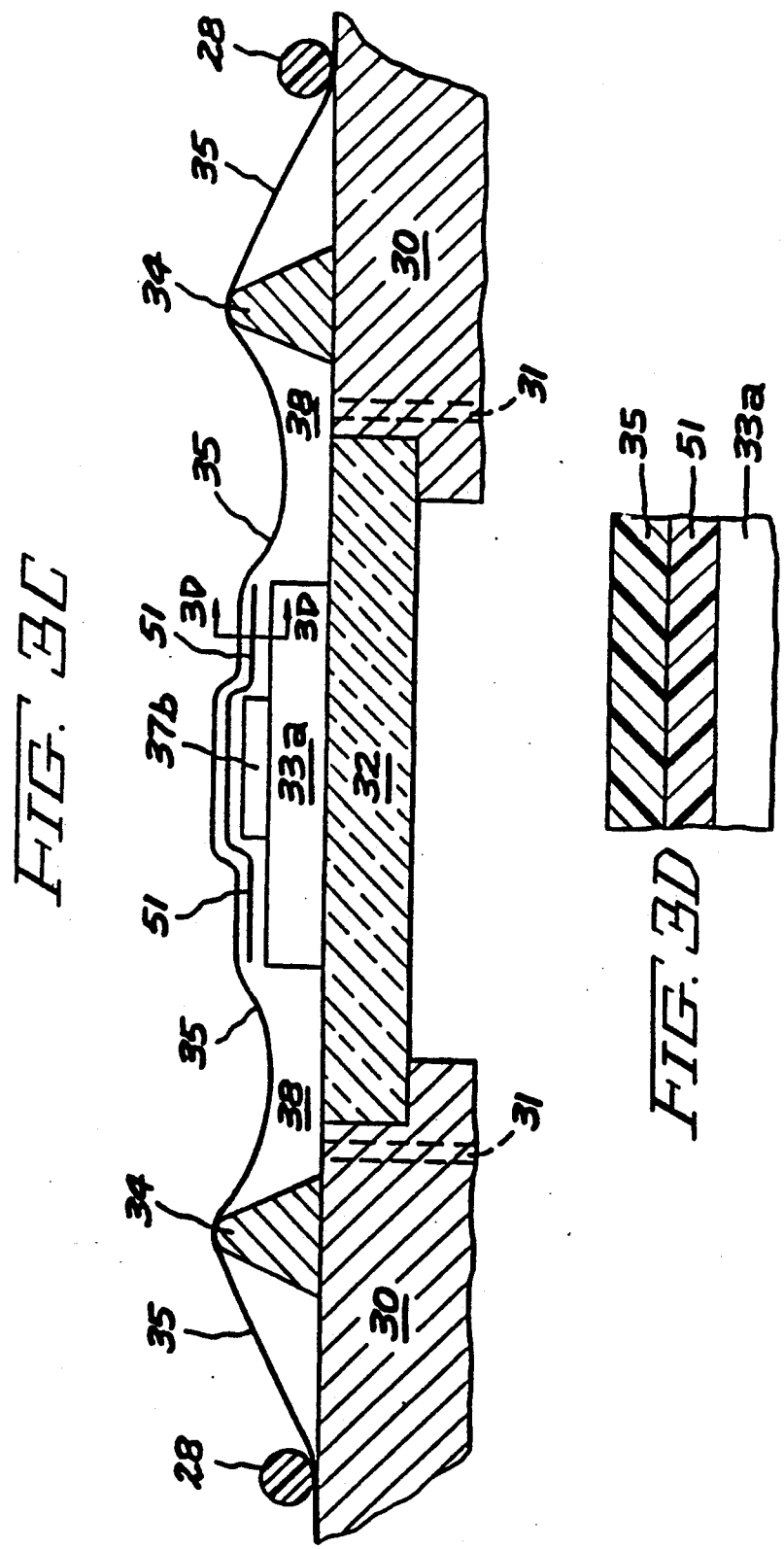

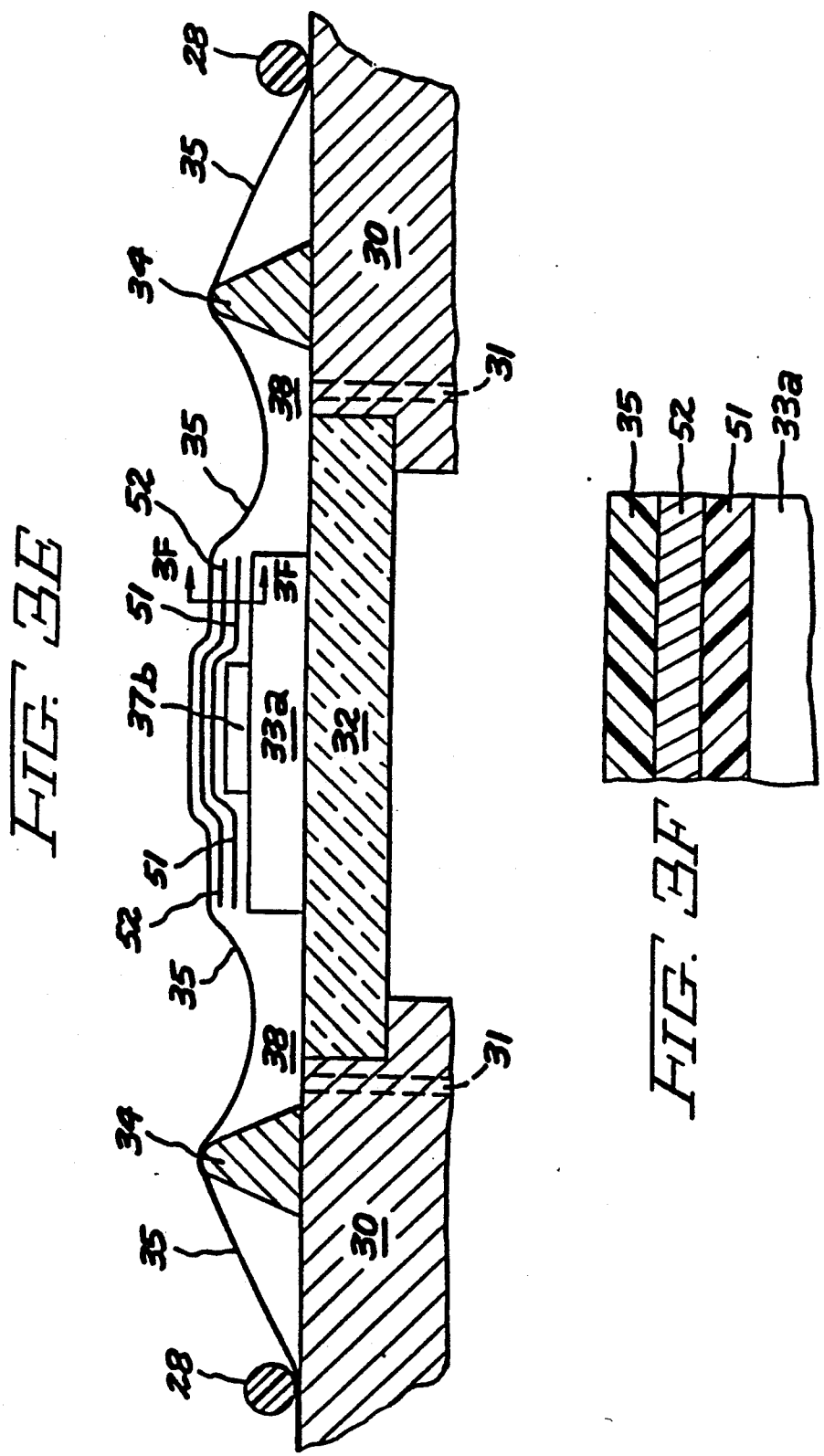

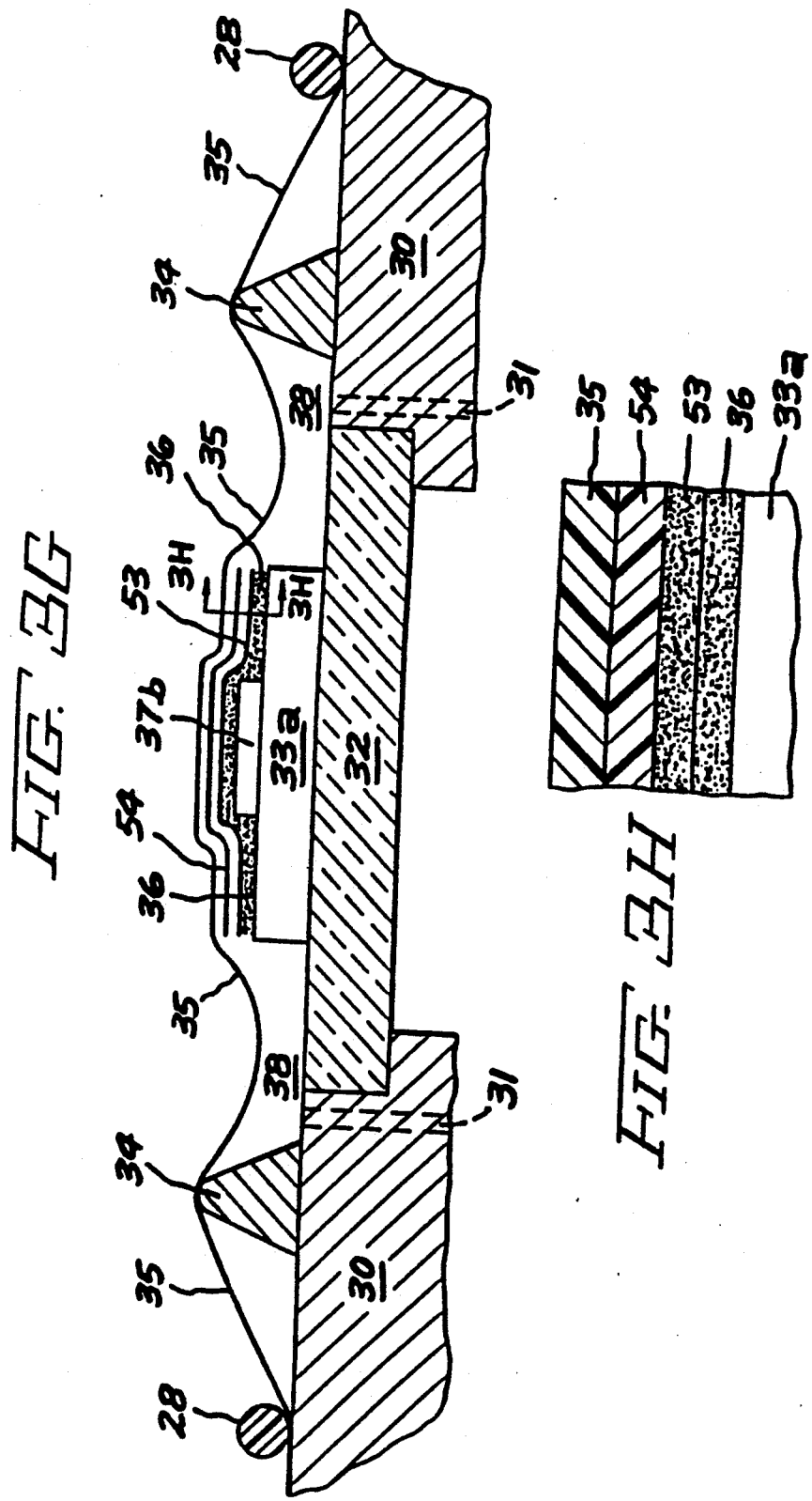

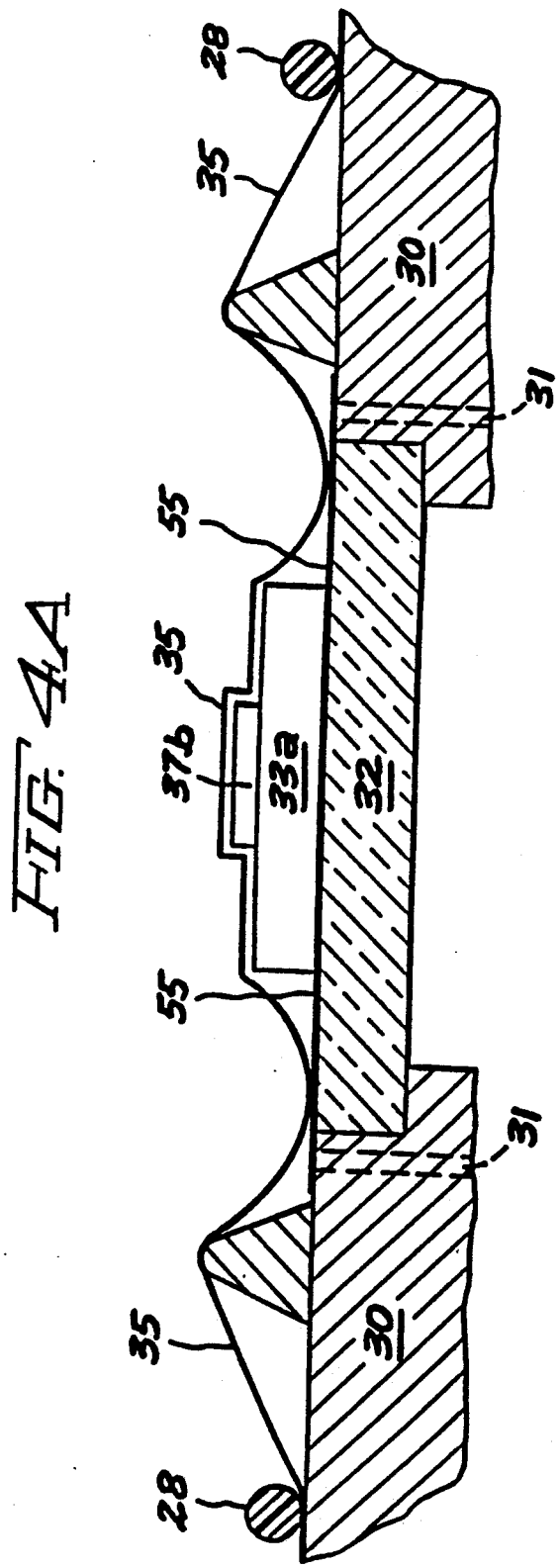

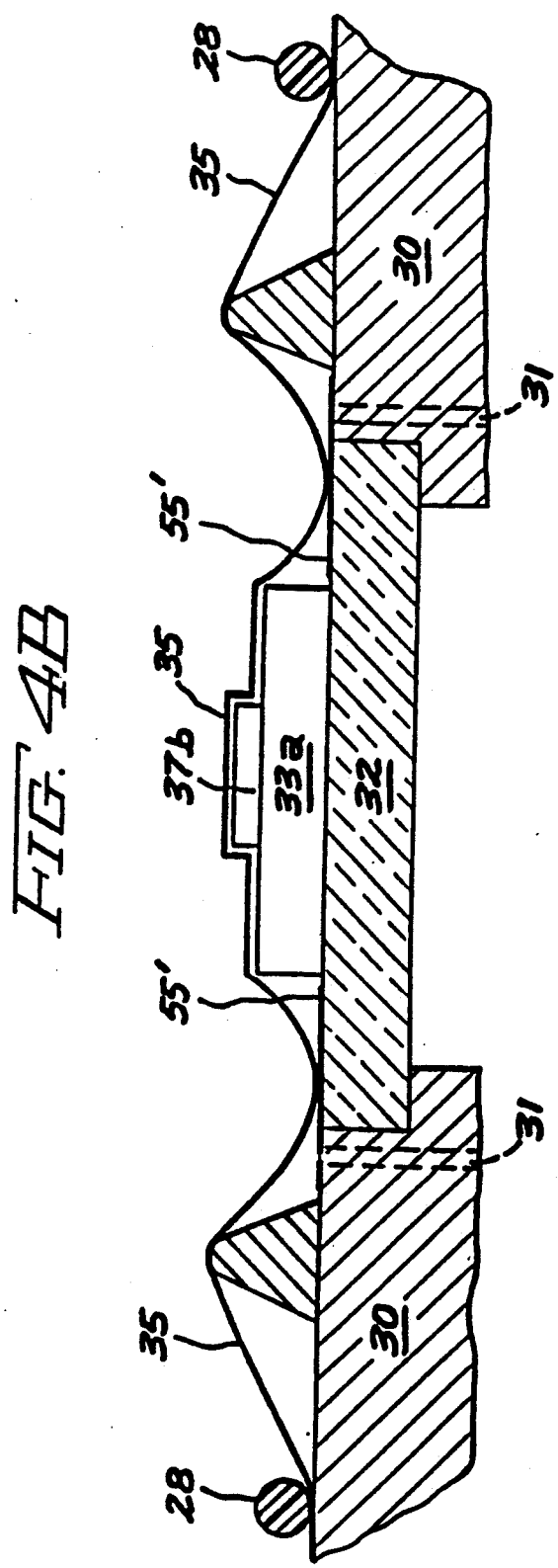

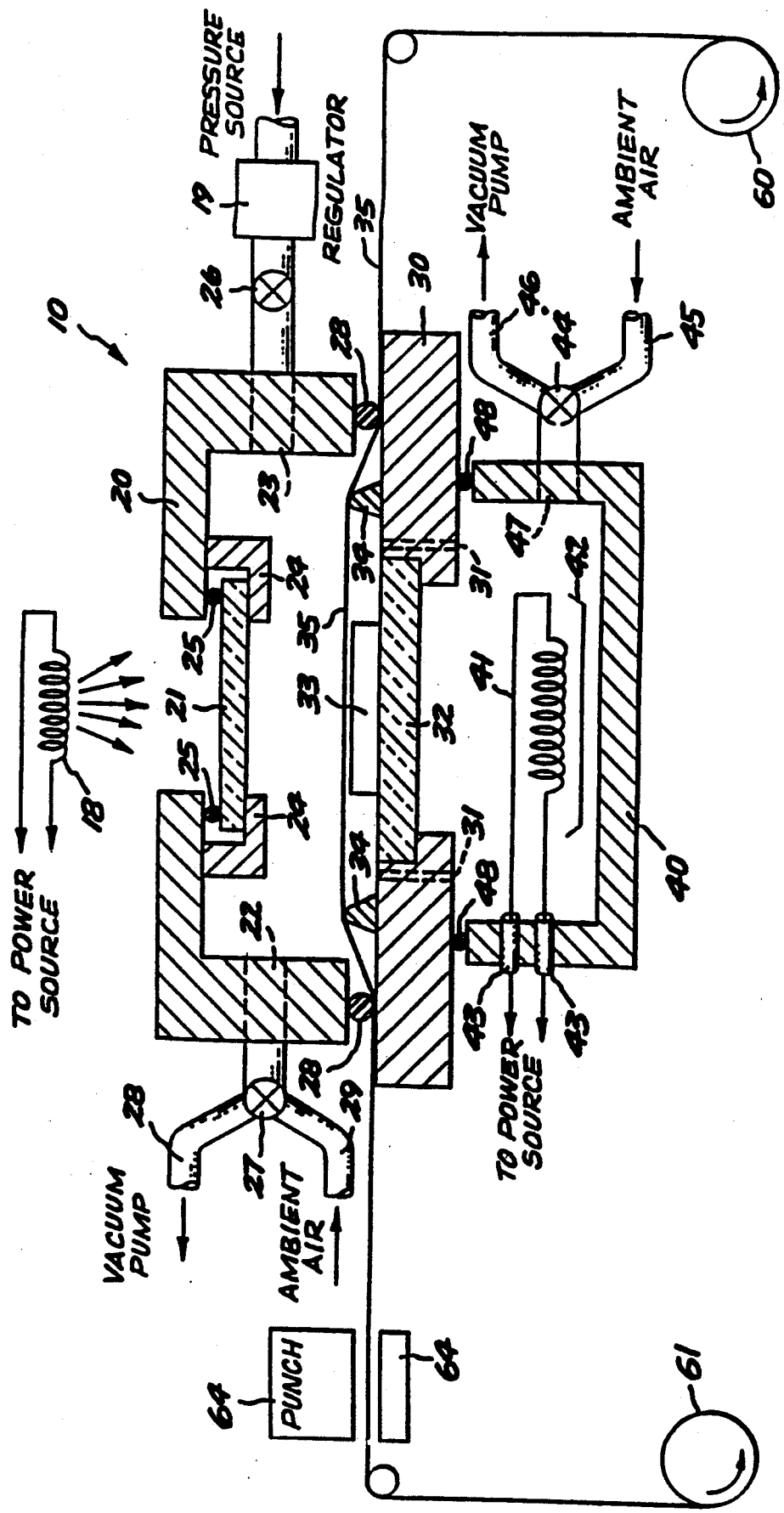

APPARATUS FOR PACKAGING INTEGRATED CIRCUIT CHIPS EMPLOYING A POLYMER FILM OVERLAY LAYER

This is a division of application Ser. No. 240,367, filed Aug. 30, 1988, now U.S. Pat. No. 4,933,042, which in turn is a continuation of application Ser. No. 912,455, filed Sept. 26, 1986, and now abandoned.

BACKGROUND OF THE INVENTION

The present invention is generally directed to a method and apparatus for laminating a polymer film over the surface of an irregular substrate, particularly a substrate on which a plurality of integrated circuit chips are affixed. More particularly, the present invention relates to a packaging method for electronic integrated circuit chips, particularly very large scale integrated (VLSI) devices. Moreover, the method and apparatus of the present invention provides a polymer film overlay for not only retaining "microchips" on a substrate, but also provides a means for interconnecting these devices. Even more importantly, the method and apparatus of the present invention provide removable interconnection capabilities.

In the packaging of very large scale integrated circuit devices, a great deal of space is taken up by mechanisms for interconnecting one chip to an adjacent device. This makes the packaging of integrated circuit devices and electronic components based thereon larger than necessary. As a result of this, many individuals are involved in the development of so-called wafer-scale integration processes. However, the efforts expended in these directions have generally tended to be limited by the problem of yield. Because a certain number of chips or dies on a wafer are often found to be defective, the number of wafers that are produced that are completely usable is generally lower than is desired. Furthermore, there still exists the problem of interconnecting the various chips on a wafer and the concomitant problem of testing a large system, such as results when a number of highly complicated individual integrated circuit components are interconnected. Accordingly, it is seen that it would be very desirable to be able to construct wafer scale integrated circuit packages from individual, easily testable integrated circuit chips. It is to this end that the present invention is directed.

More particularly, the present invention is directed to a method and apparatus for applying a polymer film overlay. This film covers a plurality of integrated circuit chips disposed adjacent to one another on an underlying substrate. Furthermore, the polymer film of the present invention provides an insulative layer for interconnection of these individual circuit chips. A significant advantage of the system of the present invention is the ability to remove one or more of these interconnection layers so as to provide a multitude of arrangement and testing capabilities.

One of the generic problems sought to be solved by the system of the present invention is the laminating of a polymer film to an irregular substrate. Certain laminating methods suffer from several deficiencies that become extremely important when one is trying to dispose film material on integrated circuit devices. This is particularly true in those circumstances in which passivation layers have not yet been applied to such devices. One method of continuous lamination is so-called roll lamination in which a substrate to be laminated is passed between two heated rollers and the pinching effect of the rollers, combined with heat, laminates the film to the substrate. Several problems exist in this approach. The approach is adequate if the substrate is perfectly flat. However, the rollers cannot comply to an irregular surface, with the result being a poor lamination in low spots and overpressure effects in high spots. Also, a substrate with an irregular surface on the bottom side would damage the lower roller or the substrate For example, pins coming down from the bottom of a package would be damaged. Another problem with roll lamination occurs when high temperatures are required to process high temperature adhesives. Compliant materials are not available with high temperature capabilities. Silicone materials seem to be the best known compliant substances for this purpose. However, this material tends to revert to a sticky goo at temperatures around 200° C. A third problem also exists with this methodology since it is necessary that the top roller touch the material to be laminated. It is impossible then to prevent contamination on the top roller from contaminating the surface of the polymer being laminated. This problem is especially serious with rollers comprising silicone material. Silicone materials produce outgassing products which contaminate the top surface and prevent good adhesion when subsequent layers are applied to the top surface of the film being laminated.

A second method used in laminating involves the use of a vacuum bag. In this system, a bag formed of high temperature material is placed around the materials to be laminated. The bag is evacuated and the bag placed in an oven. There are several problems associated with the vacuum bag methodology, however. One problem is that it is not a continuous process. That is, material to be laminated must be placed in the bag, the bag evacuated, the bag placed in an oven for a period of time, and after lamination, the laminated piece is removed from the bag. Automatic feed of material is therefore precluded. The second problem with vacuum bag methodologies is that the pressure is limited to the outside air pressure, even in the face of a perfect vacuum. Still another problem with this method is that the vacuum bag touches the top of the material being laminated. Contamination from the bag can then be transferred to the material being laminated.

A third laminating method is the standard press lamination. In this method, the material to be laminated is placed between two heated platens which are forced together by means such as a hydraulic jack. This technique works if the materials to be laminated are flat. If the substrate to be laminated is irregular in shape, or if there are small particles on the surface of the substrate to be laminated, very high pressures where the particles are present will punch through the film to be laminated and no pressure is available at the low points on the substrate. The thinner the film, the greater this problem becomes. A partial solution to this problem is the use of compliant pads to absorb some of the pressure differential. However, compliant pads contaminate the top surface of the film to be laminated and, in high temperature situations, there are no suitable compliant pad materials available. An additional problem of press laminating is that it takes time and energy to cool and heat the relatively high thermal mass platens. The platens must be physically thick structures because they are required to take high pressures over a large area without bending. An additional problem with press laminating is the removal of air and by products of the heating of adhesives during the lamination process, since the pressure tends to trap air and byproducts and tends to form blisters.

Additional problems occur when the film to be laminated to a substrate is a thermoplastic. Unless the top press pad has a special release property, the thermoplastic often will stick as well to the top press pad as it does to the substrate. Another problem exists in that no compliant pad can provide the dual function of maintaining constant pressure on the thermoplastic film at the same time that it perfectly matches the contour of the underlying substrate. Accordingly, it is seen that certain laminating methodologies are inappropriate for use in facilitating the construction of wafer scale integrated circuit devices, as contemplated herein.

SUMMARY OF THE INVENTION

In accordance with a preferred embodiment of the present invention, a method for applying a polymer film to an irregular substrate includes the following steps. The film is disposed over the substrate in close proximity to it, but not in substantial contact with it. Vacuum conditions are then applied above and below the film so as to maintain the non-contact condition. The film is then heated under vacuum conditions and fluid pressure is applied above the film so as to move it into contact with the substrate. As contemplated herein, the substrate is typically irregular because it has itself disposed thereon a plurality of integrated circuit chip dies. These dies may even represent integrated circuit chips from different chip technologies such as silicon based chips and gallium arsenide based chips. Such chips are not limited to comprising only silicon based chips. As used herein and in the appended claims "substantial contact" is that contact which would preclude the removal of air and/or gaseous products.

In accordance with another preferred embodiment of the present invention, an apparatus for applying a polymer film to an irregular substrate comprises a substantially flat substrate holder assembly for supporting the substrate and the polymer film at a certain distance over the substrate. The apparatus is provided with a movable upper chamber which is sealable against the holder assembly and the film. A film riser is disposed on one side of the holder assembly so as to form a dam-like a structure around the substrate and disposed so as to be enclosable by the movable chamber. Means are supplied to apply vacuum conditions to a volume bounded by the holder assembly, the film riser and the polymer film. Means are also provided to heat the film. The movable chamber is also generally provided with means for applying both vacuum and pressure conditions on the upper surface of the film. As used herein and in the appended claims, the term "chamber" does not refer to a void, but rather to means for defining an enclosed volume.

Accordingly, an object of the present invention is to provide a method for laminating a polymer film to an irregular substrate which provides for removal of process gasses or trapped air at the surface of the polymer film and the substrate and also provides for adding additional pressure to the top surface of the film to be laminated.

Another object of the present invention is to provide a laminating device which can accommodate to a continuous roll-to-roll process.

A further object of the present invention is to provide a device for laminating a polymer film without contact to the top surface of the film being laminated.

Yet another object of the present invention is to allow heating of the substrate from the bottom as well as heating from the top and to allow the application of ultraviolet radiation for the purpose of curing photosensitive material through a polymer layer.

A still further object of the present invention is to provide a method of laminating thermoplastic layers which accurately follow the contours of an irregular substrate and which do not need a release layer covering a thermoplastic film.

Another object of the invention is to provide a device without high thermal mass platens so that heating can be accomplished by infrared energy impinging directly on the surface and where fast cooling can be achieved by allowing a flow of gas or other coolant fluid over the top surface of the film being laminated while still maintaining pressure on the film.

Yet another object of the present invention is to provide a device for laminating polymer films to an irregular substrate in which vacuum can first be applied until a melting or other predetermined temperature is reached, with subsequent application of pressure, thus allowing the maximum removal of gas before pressure forces final compliance of the film to be laminated.

A still further object of the present invention is to provide a device in which special processing gasses can be admitted either between the substrate and the laminating film or above the laminating film.

Lastly, but not limited hereto, it is an object of the present invention to provide a method for packaging integrated circuit devices and in particular, packaging of such devices in a fashion so as to provide interconnection means for wafer scale integration methodologies.

DESCRIPTION OF THE FIGURES

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

FIG. 2A is a cross-sectional side elevation schematic view showing detail from a portion of FIG. 1 and more particularly illustrating the relationship of the polymer film and the substrate to be laminated prior to contact;

FIG. 2B is a view similar to FIG. 2A except that the film is now shown in contact with and complying to the surface of the substrate;

FIG. 3A is a view more particularly illustrating the use of separate lamination films and sealing films;

FIG. 3B is a cross-sectional side elevation view showing a detailed view of the layered structures in FIG. 3A;

FIG. 3C is a view similar to FIG. 3A, but more particularly showing the utilization of a thermoplastic laminating film and a release sealing layer;

FIG. 3D is a cross-sectional side elevation view showing a detailed portion of the layer structure in FIG. 3C;

FIG. 3E is a view similar to FIG. 3A, but more particularly showing the utilization of a thermoplastic laminating film with a thin metal deposit thereon for release;

FIG. 3F is a cross-sectional side elevation view showing a detailed portion of the layered structure in FIG. 3E;

FIG. 3G is a view similar to FIG. 3A more particularly illustrating a method for laminating a dry film resist;

FIG. 3H is a cross-sectional side elevation view more showing a detailed portion of the layered structure of FIG. 3G;

FIG. 4A is a view illustrating the use of a metal foil as release mechanism, particularly for use with thermoplastic films;

FIG. 4B is a view similar to FIG. 4A, but more particularly including an aperture in the metal foil for facilitating the heating of substrate 33;

FIG. 6 is a partial cross-sectional side elevation view similar to FIG. 1 more particularly illustrating an apparatus with continuous roll-to-roll capability.

DETAILED DESCRIPTION OF THE INVENTION

Figure 1:
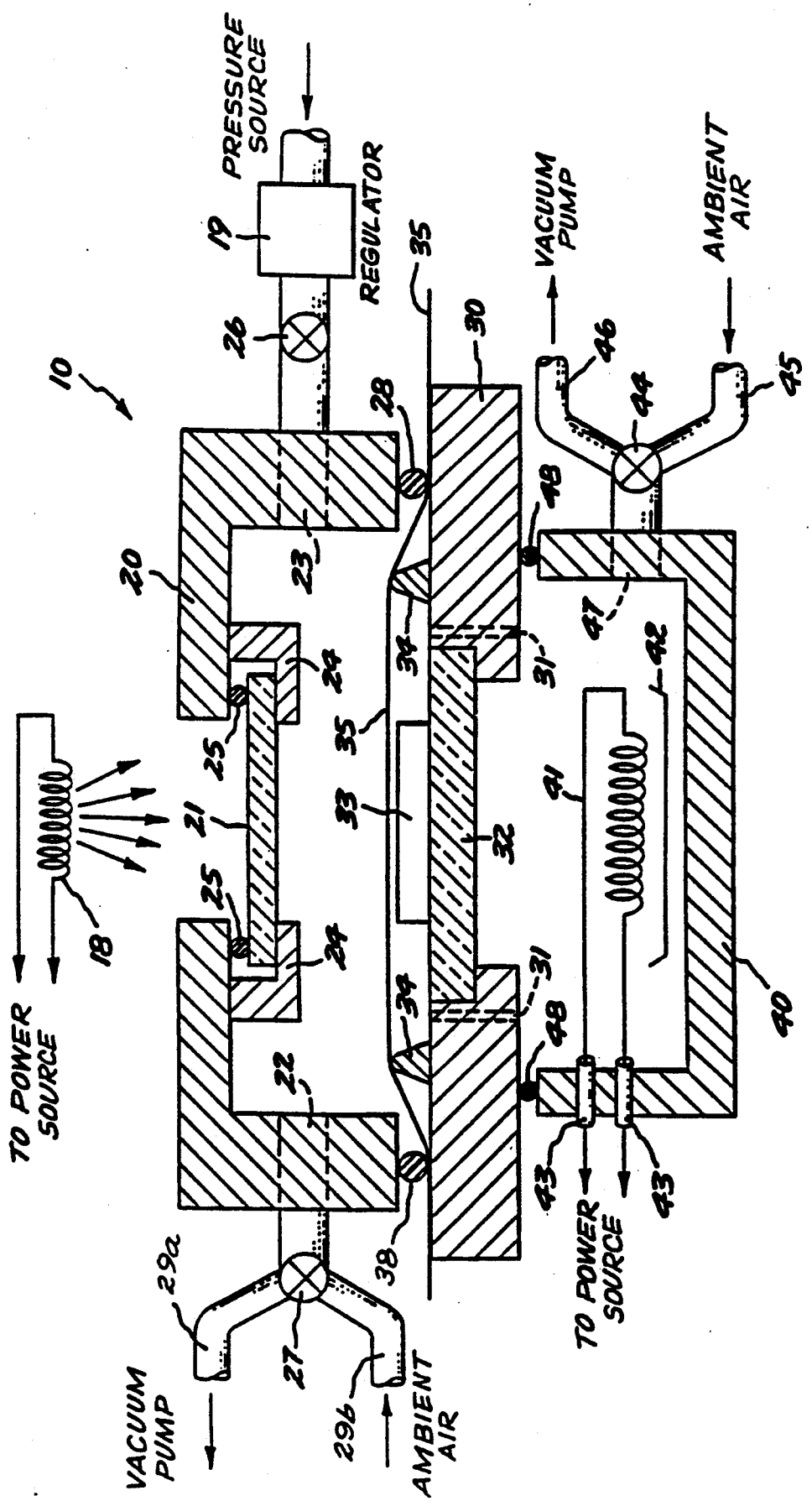
FIG. 1 is a partial cross TM sectional side elevation view of an apparatus in accordance with the present invention.

FIG. 1 shows a cross-sectional diagram illustrating the basic components of an apparatus 10 in accordance with a preferred embodiment of the present invention. The components of the apparatus include substrate holder 30 upon which workpiece 33 is positioned for processing. Substrate holder assembly 30 preferably includes infrared transmissive window 32 disposed in a recess in a holder assembly. Window 32 preferably comprises a low thermal mass. Substrate holder assembly 30 also includes fluid ports 31 for producing vacuum conditions beneath film (or seal material) 35. Also, substrate holder assembly 30 includes film riser 34 disposed on the holder assembly so as to support film 35 above workpiece 33 so that contact between the film and the workpiece does not occur until desired.

The apparatus of FIG. 1 also includes upper, movable chamber 20 which is sealable against holder assembly 30 and the polymer film by means of gasket or seal 28. Upper chamber assembly 20 includes means for producing both vacuum and pressure conditions above the polymer film. In particular, upper chamber 20 includes flow conduit 22 connected to three-way valve 27 which is selectable to connect upper chamber 20 to a vacuum pump through conduit 29a or to ambient atmospheric pressure conditions through conduit 29b. Upper chamber 20 also includes flow conduit 23 connected to pressure regulator 19 through valve 26. This provides a means for applying fluid pressure above polymer film 35 when movable chamber 20 is positioned so as to be sealed against polymer film 35 and substrate holder assembly 30 (as shown). Upper chamber 20 also preferably includes infrared transmissive window 21 disposed so as to be sealably affixed as shown, using gasket or seal 25 and retention assembly 24. Also preferably included is radiant infrared energy heat source 18 which is disposed above window 21 and provided to heat film 35 and workpiece 33 from above.

In a similar manner a lower chamber 40 is provided beneath window 32 and is structured so as to be sealably affixed to holder assembly 30, as for example, by seals or gaskets 48. Lower chamber 40 is designed to maintain either ambient atmospheric pressure or vacuum conditions. Lower chamber 40 also preferably includes heater 41 together with infrared reflector 42 which is positioned so as to direct radiant infrared energy through infrared transmissive window 32 so as to heat workpiece 33 and film 35 from below. Heater 41 is preferably electrically powered, as for example, from feedthroughs 43. Lower chamber 40 also includes flow conduit 47 which is connected to three-way valve 44. This valve is selectable so as to connect the volume of lower chamber 40 with vacuum conditions through conduit 46, or to ambient air conditions as through conduit 45.

Apparatus 10 shown in FIG. 1 is generally operable in the following manner to produce the result desired. In operation, a workpiece 33 is placed on substrate holder assembly 30 and the workpiece is covered (but not contacted) by the polymer film to be laminated. In one exemplary embodiment, the workpiece is precoated with a thermoplastic adhesive. Upper chamber 20 is then forced into intimate contact with polymer film 35 and substrate holder assembly 30. This forms a seal on one side between the polymer film and the upper pressure chamber assembly, and on the other side between the polymer film and the substrate holder assembly. Particular attention is now directed to vacuum ports 31 in substrate holder assembly 30. When vacuum is drawn through these ports, through lower chamber 40, a vacuum is formed throughout the volume under the polymer film up to the point where the polymer film seals with the substrate holder assembly. This vacuum removes air from between the polymer film and the workpiece and allows intimate contact therewith. Generally, however, vacuum conditions may also be applied simultaneously to the upper chamber assembly 20 to keep the film from sealing irregular areas on the substrate which would prevent the lower vacuum from removing all gas from between the polymer film and the workpiece. Film risers 34 are important during this phase to keep the film from touching the workpiece. This is especially important when adhesive on the workpiece becomes tacky. On subsequent heating, the vacuum removes outgassing products generated by the heating of any adhesive, the polymer film, and the workpiece. After suitable outgassing, pressure is applied to the top of the polymer film by admitting gas or other fluid to the upper chamber assembly. A uniform pressure is now applied to the polymer film throughout the volume of the upper chamber assembly out to the point where the chamber assembly seals to the polymer film. The gas admitted to the pressure chamber assembly cannot escape because of the seal between the pressure chamber and the polymer film. Heating of the substrate may be achieved in several different ways. In the preferred embodiment, the workpiece is placed on transparent window 32. This allows infrared radiation from lower heater element 41 to impinge directly on workpiece 33 and to thereby heat the workpiece with very little heating of the window assembly. In addition, a window is preferably placed in the upper pressure assembly and additional radiative energy is applied to the polymer film from above and, through the polymer film, to the workpiece itself. Very rapid heating of the substrate is achieved because of the low thermal mass of the supporting structure. Note also that hot gas or even a hot liquid can be admitted through inlet 23 of the pressure chamber to provide for very rapid heating on the surface of the polymer film. In addition, cooling can be effected by supplying a cooling gas and providing a flow through an outlet port of the upper chamber assembly such that pressure is maintained on the polymer film while a flow of cooling gas rapidly cools the film and the substrate.

In accordance with a preferred embodiment of the present invention, the method and apparatus disclosed herein is particularly adapted to the situation in which workpiece 33 includes a substrate on which there is disposed a plurality of integrated circuit chips. These chips may be affixed to the substrate by any suitable adhesive means. Accordingly, in accordance with the present invention, the resultant product comprises a substrate containing a plurality of integrated circuit chips covered by a thin polymer film in which apertures may be formed and on which conductive patterns may be disposed so as to interconnect the integrated circuit chips. In accordance with preferred embodiments of the present invention, the substrate on which the chips are disposed preferably comprises a material such as ceramic. However, usable substrates also include metals, glass, plastics, and composites. It is also a significant feature of the present invention that the polymer film disposed over integrated circuits as described above is removable and thereby provides a mechanism for reconfiguration and independent testing of integrated circuit chips.

It should be appreciated that the method and apparatus described above solves many of the significant problems associated with trying to fabricate such integrated circuits. In particular, it is seen that the apparatus and method described herein alleviate problems associated with high temperature processing and also problems associated with disposing films on irregularly shaped surfaces such as those defined by a plurality of integrated circuit chips disposed on an underlying substrate. It also alleviates the problem of removing outgassing products.

FIG. 2A is an enlargement of a portion of the view shown in FIG. 1. More particularly, FIG. 2A illustrates the conditions present before contact is made between film 35 and workpiece 33 shown herein in more detail. In particular, workpiece 33 includes substrate 33a on which is affixed integrated circuit chip 37b. Also shown present on substrate 33a is undesired particle 37a, shown here only for purposes of illustration. A coating of adhesive 36 is also shown over substrate 33a and chip 37b. Polymer film 35 is seen disposed above but not in contact with either the workpiece or the adhesive. In this condition, intimate contact with the substrate has not yet been achieved so that air and outgassing products are drawn out so that they do not form blisters in the final laminated structure. This also removes undesirable contaminants from the surface of the chip. After heating for a period of time, the adhesive melts and pressure is applied to the top surface of film 35, as described above. The resulting condition is shown schematically in FIG. 2B. Note that the polymer film now complies accurately to the shape of the irregular substrate. Note also that the polymer film complies to the shape of particle 37a. It is important to point out here that the particle, while undesired, is effectively covered by the polymer film without the very sharp particle punching through the polymer film. In the case of compliant pads or rollers, a very high pressure gradient would be produced around the area of the particle with a danger that the particle would punch through the thin polymer film. In the present invention, the pressure on all areas of the polymer film is the same and comes from a pressurized gas or liquid. This forces the best possible compliance to an irregularly shaped substrate, but yet prevents undue pressure gradients on edges and sharp particles. In addition, evacuating the area between the polymer and the workpiece ensures, intimate, void-free contact between the polymer and the to substrate.

FIGS. 3A and 3B illustrate alternate embodiments of the present invention and in particular, alternate combinations of polymer film and workpiece which can be handled by the apparatus shown in FIG. 1. In particular, FIG. 3A shows a situation in which adhesive 36 coats an irregular workpiece. Film 50, to be bonded to the workpiece, is placed over it with second sealing film 35 actually forming the seal between the vacuum and pressure areas of the structure. This configuration is advantageous for laminating small pieces of film to a substrate. It is also advantageous where a large continuous film might not be practical. For example, when the film to be bonded is very thin and could not support reliably the high pressures of the process without the possibility of punch-through, the configuration of FIG. 3A is desirable. This configuration is also advantageous where the film to be bonded does not completely cover the substrate. This case occurs when a repair or interconnect patch is being added to a substrate. FIG. 3B provides a more detailed view of the layered structures shown schematically in FIG. 3A.

The adhesive shown in FIG. 2 or FIG. 3A can either be a thermoplastic, a thermoset, or an ultraviolet curable adhesive Examples of curing conditions for each type adhesive are now considered. For example, when using a thermoplastic adhesive such as ULTEM ®, the workpiece is preferably heated to a temperature of 260° C. under vacuum for three minutes, after which a pressure of approximately 30 pounds per square inch is applied and cooling is started immediately. When using an acrylic adhesive, it is preferable to heat the workpiece to a temperature of approximately 200° C. under vacuum condition for three minutes and to then apply pressure of approximately 30 pounds per square inch, holding the temperature and pressure constant for approximately 30 minutes before beginning cooling. In the case of an ultraviolet curable epoxy adhesive, the workpiece and adhesive is heated to a temperature of approximately 40° C. under vacuum conditions for 20 seconds after which a pressure of approximately 30 pounds per square inch is applied. The material is irradiated with 200 W/in from a Hanovia uv lamp moved slowly back and forth across the substrate to provide uniform coverage The epoxy is exposed for 5 to 10 seconds and the pressure is released.

An alternate embodiment of the present invention is illustrated in FIGS. 3C and 3D. In this case, a thermoplastic film 51 is laminated directly to the workpiece. Here, thermoplastic film 51 is covered by a film 35 which now acts as a release film and which actually provides the seal between the vacuum and pressure areas. Substantial flow of the thermoplastic film can be accommodated because release film 35 complies with the substrate, but does not flow. An example in accordance with this embodiment employs a polysulfone film such as 1 mil thick UDEL ™ film made by Union Carbide. This film is heated to a temperature of approximately 250° C. in vacuum and a pressure of approximately 20 pounds per square inch is thereafter applied following which slow cooling is initiated after about one minute at 250° C. FIG. 3D provides a more detailed view of the layered structures shown schematically in FIG. 3C.

FIGS. 3E and 3F show another embodiment of the present invention In cases where thermoplastic material 51 adheres well to the overlying release film 35, metal layer 52 can be deposited on the thermoplastic before the laminating cycle. Here thin metal layer 52 prevents thermoplastic 51 from actually contacting overlying laminating layer 35 and thereby prevents adhesion between thermoplastic 51 and overlying layer 35. For example, in this embodiment, a 1,000 angstrom thick layer of chromium, together with a 2,500 angstrom thick layer of aluminum may be deposited on a polysulfone film. See FIG. 3F for a detailed view of the layered structure shown in FIG. 3E.

In yet another embodiment of the present invention, it is possible to laminate a dry film photoresist using the method and apparatus of the present invention. For example, dry film photoresist such as RISTON TM (as supplied by Dupont de Nemours Company, Inc.) consists of three primary layers: MYLAR TM carrier layer 54, resist layer 53 and an adhesive layer 36. The material is designed to be laminated in a roll laminator. However, if an irregular substrate is encountered, the dry film resist can be laminated as shown in FIG. 3G using the apparatus of FIG. 1 For this film, a temperature of 100° C. for a period of approximately one minute, with a pressure of approximately 30 pounds per square inch is sufficient to give very adherent, well-complied photoresist coverage. The carrier layer 54 can also be used as the seal layer 35 in yet another embodiment. See also FIG. 3H for a detailed view of the layer structure.

It is also possible to employ a thermoplastic film as the film which also forms the seal between the vacuum and pressure regions. FIGS. 4A and 4B illustrate two embodiments of the present invention which permits this kind of lamination. In FIG. 4A, metal foil 55, such as aluminum, is placed under the workpiece and continues out to the sealing regions. Thermoplastic film 35 covers the workpiece. On subsequent heating, thermoplastic film 35 softens and adheres both to the substrate and to metal foil 55. If the foil were not placed under the substrate and out to the sealing regions, the thermoplastic material would tend to stick to the substrate holder assembly and not allow removal of the substrate. This is undesirable. FIG. 4B illustrates an alternate embodiment of this procedure in which metal foil 55' possesses a cutout or cutouts to accommodate the substrate and to also thereby allow radiant energy to impinge directly on the substrate from below and so as to thereby heat the workpiece more efficiently.

Figure 5:
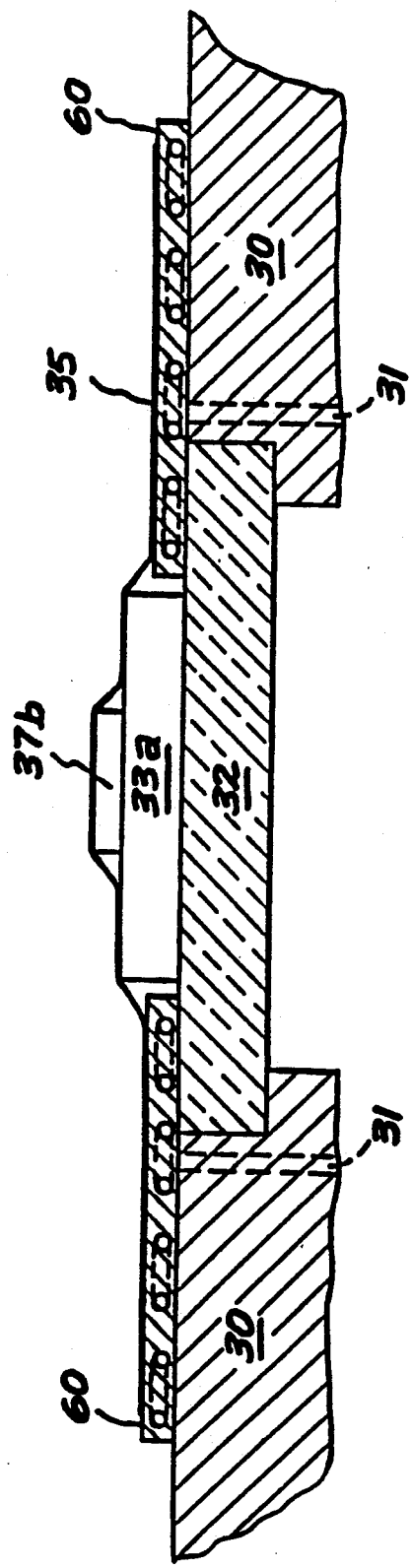
FIG. 5 is a cross-sectional side elevation view particularly illustrating the utilization of cooling means to prevent thermoplastic melting except over the substrate.

FIG. 5 illustrates yet another embodiment of the present invention in which a cooled copper insert 60 is provided around the workpiece to prevent the melting of the thermoplastic layer beyond the edges of the workpiece and to thereby prevent adhesion of the thermoplastic to the substrate holder assembly.

FIG. 6 illustrates yet another embodiment of the present invention and particularly shows a side view of the basic pressure laminator of FIG. 1 adapted for roll-to-roll processing. In this system, adhesive coated workpieces, such as 33, are fed at right angles to the direction of motion of polymer film 35. As each new substrate is positioned on the substrate holder assembly, the pressure chamber assembly is forced over the polymer film, thereby making a seal for both the vacuum section and the pressure section. The evacuating, pressurizing, heating, application of radiant energy and cooling by gas flow, as required for the process, take place as described above. When the substrate is sufficiently cooled, the pressure chamber is retracted and the polymer film is rolled from supply reel 65 to such a position that the laminated substrate moves from right to left with a new portion of film 35 transported into the laminating position and a new substrate is positioned in the substrate holder assembly. At this point, the process can be repeated. Substrates are either rolled up on the takeup roll or punched out of the center of the film by punch 64. The process can also be adapted to incorporate film cleaning and inspection apparatus so that defective portions of the film can be bypassed simply by continuing the rolling process until the film overlying the substrate is free of defects. Throughout the discussion thus far, the adhesive has been described as being present on the substrate. It is equally possible to apply the adhesive directly to the polymer film. A suitable process in which adhesives are applied to the film is now presented. For example, one side of a KAPTON TM polyimide film as supplied by Dupont de Nemours Company, Inc. is etched for 6 minutes at 300 watts in a gas comprising 50% $CF_4$ and 50% oxygen at a pressure of 0.4 torr in a barrel plasma etcher. A solution of 26 gram ULTEM ® (as supplied by the General Electric Company) resin, 104 grams of methylene chloride and 155 grams acetophenone is sprayed on the etched KAPTON TM film. The etched and sprayed film is dried at a temperature of approximately 180° C. for three minutes, after which it is baked at a temperature of 350° C. for approximately five minutes.

It is noted that the apparatus and method described herein provides an extremely convenient, economical and facile mechanism for covering integrated circuit chips which are disposed on an underlying substrate. The presence of the circuit chips provides one of the most significant of the irregularly shaped surfaces contemplated herein. It is noted, however, that the advantages of the present invention are nonetheless obtainable even when only a single chip is covered in accordance with the present invention. In particular, apertures are provided in the polymer film, as by laser methods such as described in concurrently filed application Ser. No. 912,455, filed Sept. 26, 1986, now U.S. Pat. No. 4,714,516, issued Dec. 22, 1987, titled "Method to Produce Via Holes in Polymer Dielectrics for Multiple Electronic Circuit Chip Packaging". This patent, assigned to the same assignee as the present invention, is hereby incorporated herein. A layer of metallization may then be deposited and patterned so as to provide interconnections between various interconnection pads on the circuit chips. In this way, connections can be made to different parts of the same chip or between chips. A significant advantage of the present invention is that the polymer film is removable. This provides a mechanism for testing and later reconfiguration. A multichip integrated circuit packaging configuration and method in accordance with the present invention is disclosed in concurrently filed application Ser. No. 912,456, filed Sept. 26, 1986, now U.S. Pat. No. 4,783,695 also assigned to the same assignee as the present invention. This patent application is also hereby incorporated herein by reference.

From the above, it should be appreciated that the method and apparatus of the present invention provide significant advantages in the packaging of electronic circuit chip components. In particular, it is seen that the method and apparatus of the present invention provide a means for constructing wafer scale integrated circuit chip devices in an independent fashion enabling testing and reconfiguration of the devices. Most importantly, it is seen that the method of film deposition of the present invention alleviates problems associated with high temperature compliance of films to irregular surfaces. It is also seen that the film of the present invention can be removed from the devices, such as by disposing the resultant product in a suitable solvent such as methylene chloride. It is also seen that all of the foregoing objects are fully met by the method and apparatus disclosed herein.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

We claim:

1. An apparatus for applying a polymer film to an irregular workpiece, said apparatus comprising:
   a substantially flat substrate holder assembly for supporting said workpiece and said polymer film over said workpiece;
   a movable chamber sealable against a first surface of said holder assembly and said polymer film;
   a film riser disposed on said first surface of said holder assembly so as to support said film over but not in substantial contact with said workpiece;
   means to apply vacuum conditions to a volume bounded by said holder assembly and said polymer film; and
   means for heating said film, said means for heating including an infrared transparent window in an outside wall of said movable chamber positioned allow heating of said film by an external heater.

2. An apparatus for applying a polymer film to an irregular workpiece, said apparatus comprising:
   a substantially flat substrate holder assembly for supporting said workpiece and said polymer film over said workpiece;
   a movable chamber sealable against a first surface of said holder assembly and said polymer film;
   a film riser disposed on said first surface of said holder assembly so as to support said film over but not in substantially contact with said workpiece;
   means to apply vacuum conditions to a volume bounded by said holder assembly and said polymer film, said means to apply vacuum conditions including a second chamber sealable against the second surface of said holder assembly at a point thereon opposite said film riser, the volume defined by said second chamber and said holder assembly being in flow communication with the volume defined at least apart by said polymer film and said holder assembly; and
   means for heating said film, said means for heating said film including a heat disposed within said second chamber.

3. The apparatus of claim 2 in which said holder includes an infrared transparent window on which said workpiece is disposable.

4. An apparatus for applying a polymer film to an irregular workpiece, said apparatus comprising:
   a substantially flat substrate holder assembly for supporting said workpiece and said polymer film over said workpiece; said holder assembly including a low thermal mass portion on which said workpiece is disposable;
   a movable chamber sealable against a first surface of said holder assembly and said polymer film;
   a film riser disposed on said first surface of said holder assembly so as to support said film over but not in substantial contact with said workpiece;
   means to apply vacuum conditions to a volume bounded by said holder assembly and said polymer film; and
   means to heat said film.

5. The apparatus of claim 4 wherein said holder includes cooling means configured to form a recess in which said workpiece is disposable.

6. An apparatus for applying a polymer film to an irregular workpiece, said apparatus comprising:
   a substantially flat substrate holder assembly for supporting said workpiece and said polymer film over said workpiece; said holder assembly including an infrared transparent window on which said workpiece is disposable;
   a movable chamber sealable against a first surface of said holder assembly and said polymer film;
   a film riser disposed on said first surface of said holder assembly so as to support said film over but not in substantial contact with said workpiece;
   means to apply vacuum conditions to a volume bounded by said holder assembly and said polymer film; and
   means to heat said film.

* * * * *